United States Patent
Ali et al.

(10) Patent No.: US 7,894,226 B2
(45) Date of Patent: Feb. 22, 2011

(54) CONTENT ADDRESSABLE MEMORY BASED ON A RIPPLE SEARCH SCHEME

(75) Inventors: Shahid Ali, New Delhi (IN); Sharad Gupta, Uttar Pradesh (IN); Sunil Kumar Misra, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 349 days.

(21) Appl. No.: 12/124,149

(22) Filed: May 21, 2008

(65) Prior Publication Data

US 2009/0290399 A1 Nov. 26, 2009

(51) Int. Cl.
*G11C 15/00* (2006.01)
(52) U.S. Cl. .............. 365/49.1; 365/49.11; 365/49.17; 365/154; 711/108
(58) Field of Classification Search .......... 365/49.1, 365/49.17, 49.11, 154; 711/108
See application file for complete search history.

(56) References Cited

U.S. PATENT DOCUMENTS

| | | | |
|---|---|---|---|
| 6,574,702 B2 * | 6/2003 | Khanna et al. | 711/108 |
| 6,892,272 B1 * | 5/2005 | Srinivasan et al. | 711/108 |
| 7,304,876 B2 * | 12/2007 | Perry et al. | 365/49.12 |
| 7,324,362 B1 * | 1/2008 | Maheshwari | 365/49.17 |
| 7,570,503 B1 * | 8/2009 | Maheshwari et al. | 365/49.1 |
| 2005/0157526 A1 * | 7/2005 | Hanzawa et al. | 365/49 |

* cited by examiner

*Primary Examiner*—Tuan T Nguyen
*Assistant Examiner*—Toan Le
(74) *Attorney, Agent, or Firm*—John R. Pessetto; W. James Brady; Frederick J. Telecky, Jr.

(57) ABSTRACT

A scheme for ultra-low power content addressable memory based on a ripple search is disclosed. In one embodiment, a system for content addressable memory (CAM), includes a storage unit for storing a portion of content data, and a match module for comparing the portion of the content data with a respective portion of search data received by the match module. The match module includes a first static logic gate associated with a first half of the storage unit storing a sub-portion of the portion of the content data, and a second static logic gate associated with a second half of the storage unit. The first static logic gate forwards a signal for disabling the second static logic gate if the sub-portion of the portion of the content data does not match with a respective sub-portion of the portion of the search data.

16 Claims, 8 Drawing Sheets

| STATE | CONTENT BIT 1 | CONTENT BIT 2 | SEARCH BIT 1 | SEARCH BIT 2 | RESULT |
|---|---|---|---|---|---|
| 0 | 1 | 0 | 1 | 0 | HIT |
| 1 | 0 | 1 | 1 | 0 | MISS |
| X | 0 | 0 | 1 | 0 | HIT |
| INVALID | 1 | 1 | 1 | 0 | MISS |
| 0 | 1 | 0 | 0 | 1 | MISS |
| 1 | 0 | 1 | 0 | 1 | HIT |
| X | 0 | 0 | 0 | 1 | HIT |
| INVALID | 1 | 1 | 0 | 1 | MISS |
| 0 | 1 | 0 | 1 | 1 | HIT |
| 1 | 0 | 1 | 1 | 1 | HIT |
| X | 0 | 0 | 1 | 1 | HIT |
| INVALID | 1 | 1 | 1 | 1 | HIT |
| 0 | 1 | 0 | 0 | 0 | --- |
| 1 | 0 | 1 | 0 | 0 | --- |
| X | 0 | 0 | 0 | 0 | --- |
| INVALID | 1 | 1 | 0 | 0 | --- |

| STATE | CONTENT BIT 3 | CONTENT BIT 4 | SEARCH BIT 3 | SEARCH BIT 4 | RESULT |
|---|---|---|---|---|---|
| 0 | 1 | 0 | 0 | 1 | HIT |
| 1 | 0 | 1 | 0 | 1 | MISS |
| X | 0 | 0 | 0 | 1 | HIT |
| INVALID | 1 | 1 | 0 | 1 | MISS |
| 0 | 1 | 0 | 1 | 0 | MISS |
| 1 | 0 | 1 | 1 | 0 | HIT |
| X | 0 | 0 | 1 | 0 | HIT |
| INVALID | 1 | 1 | 1 | 0 | MISS |
| 0 | 1 | 0 | 0 | 0 | HIT |
| 1 | 0 | 1 | 0 | 0 | HIT |
| X | 0 | 0 | 0 | 0 | HIT |
| INVALID | 1 | 1 | 0 | 0 | HIT |
| 0 | 1 | 0 | 1 | 1 | --- |
| 1 | 0 | 1 | 1 | 1 | --- |
| X | 0 | 0 | 1 | 1 | --- |
| INVALID | 1 | 1 | 1 | 1 | --- |

FIG. 4B

CONTENT ADDRESSABLE MEMORY BASED ON A RIPPLE SEARCH SCHEME

FIELD OF TECHNOLOGY

Embodiments of the present invention relate to the field of electronics. More particularly, embodiments of the present invention relate to measurement systems, devices and circuits for content addressable memory.

BACKGROUND

A content addressable memory (CAM) is a hardware search engine made of memory and comparison circuitry. The CAM compares input search data against stored content data using the comparison circuitry, and returns the address or addresses of matching content data in a single clock cycle.

In a basic architecture of the CAM, search lines are used to forward the search data to core cells of the CAM, which includes both the memory and comparison circuitry. In addition, match lines are used to indicate whether the search data matches its corresponding content data, where the match lines are pre-charged high at the start of the CAM operation. When the search data is compared with the content data, cells with a mismatch or miss pulls down their respective match lines, whereas cells with a match or hit stay on.

The comparison circuitry, which is required for every cell in the memory, increases physical size of the CAM which in turn increases manufacturing cost of the CAM. In addition, the comparison circuitry also increases power dissipation since it is active on every clock cycle, and the match lines have to be pre-charged high before the matching operation. Furthermore, a high peak current in design of the CAM to accommodate the high power dissipation may result in a high dynamic voltage drop of the CAM's power supply. To counter the voltage drop, a significant amount of decoupling capacitance (de-cap) has to be provided to the CAM chip. The area overhead for such a remedy (e.g., implementation of de-cap transistors) may require an additional area overhead in the CAM.

SUMMARY

A scheme for content addressable memory based on a ripple search is disclosed. In one aspect, a system for content addressable memory (CAM) includes a storage unit for storing a portion of content data, and a match module for comparing the portion of the content data with a respective portion of search data received by the match module. The storage unit includes at least one static random access memory (SRAM). Also, the storage unit includes four six-transistor SRAM bit cells. The match module includes a first static logic gate associated with a first half of the storage unit storing a sub-portion of the portion of the content data. The match module further includes a second static logic gate associated with a second half of the storage unit, coupled with the first static logic gate. In addition, the first static logic gate forwards a signal for disabling the second static logic gate if the sub-portion of the portion of the content data does not match with a respective sub-portion of the portion of the search data.

In another aspect, a system for content addressable memory (CAM), includes a chain of CAM units for storing content data and comparing the content data with search data, with each CAM unit including a storage unit for storing a portion of the content data, and a match module for comparing the portion of the content data with a respective portion of the search data. The comparing the content data with the search data is performed sequentially from one end of the chain of CAM units to the other end of the chain of CAM units, and the comparing the portion of the content data with the respective portion of the search data in the match module is performed only if an enable signal is received by the match module.

In yet another aspect, a system for content addressable memory includes a plurality of chains of CAM units for storing content data and comparing the content data with search data, with each CAM unit including a storage unit for storing a portion of the content data, and a match module for comparing the portion of the content data with a respective portion of the search data. The content data and the search data is compared sequentially from one end of each chain of CAM units to the other end of the each chain of CAM units. In addition, the portion of the content data and the respective portion of the search data are compared in the match module only if an enable signal is received by the match module. Furthermore, the system for CAM includes a tree of logic gates for processing respective output signals of the plurality of chains of match modules in parallel. A match between the content data and the search data is determined only if every one of the output signals indicates a match.

The systems and apparatuses disclosed herein may be implemented in any means for achieving various aspects, and other features will be apparent from the accompanying drawings and from the detailed description that follows.

BRIEF DESCRIPTION OF THE DRAWINGS

Example embodiments are illustrated by the way of example and not limitation in the figures of the accompanying drawings, in which like references indicate similar elements and in which:

FIG. 4A is an exemplary logic table for a first static logic gate in the match module of FIG. 3, according to one embodiment.

FIG. 4B is an exemplary logic table for a second static logic gate in the match module of FIG. 3, according to one embodiment.

Other features of the present embodiments will be apparent from the accompanying drawings and from the detailed description that follows.

DETAILED DESCRIPTION

A scheme for content addressable memory based on a ripple search is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
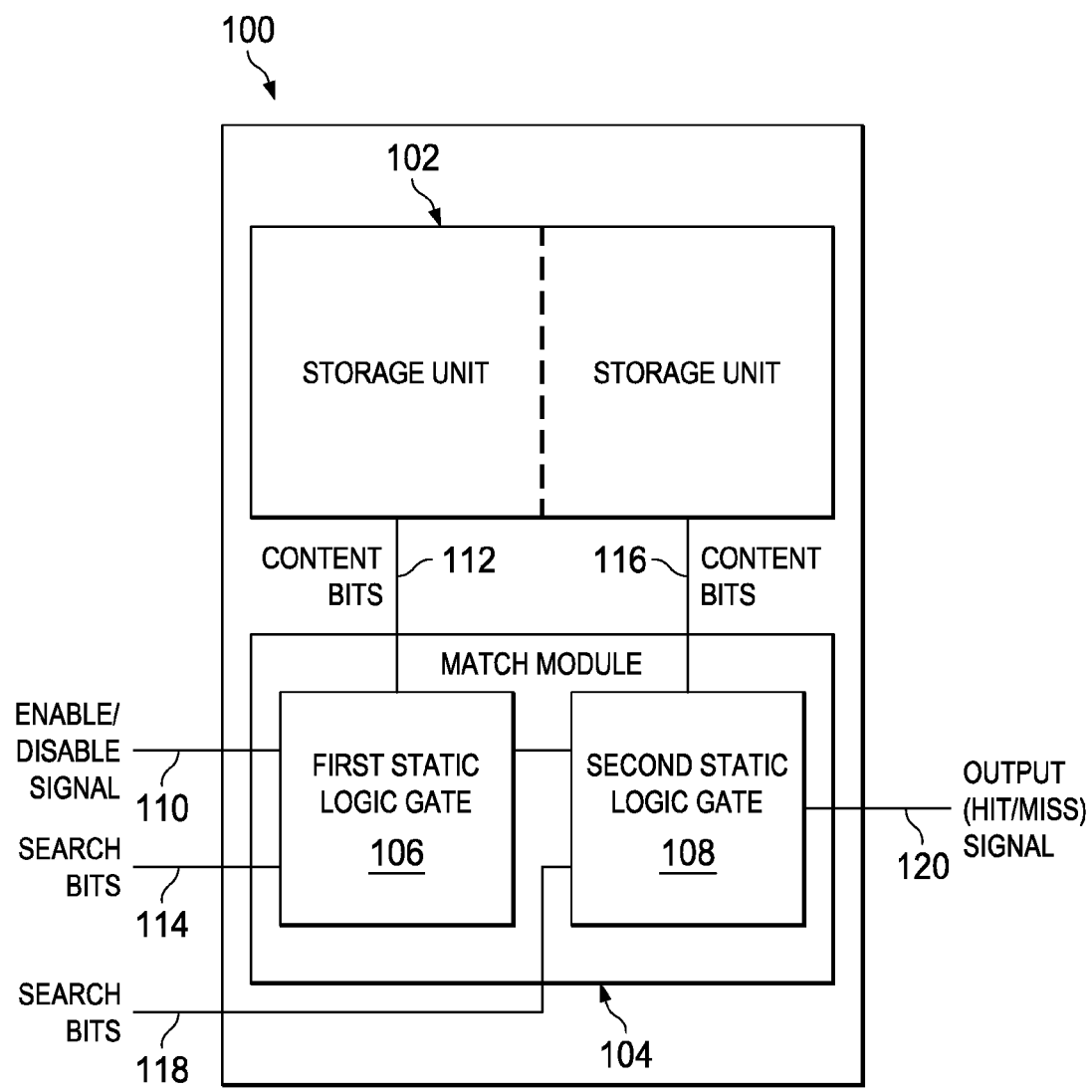
FIG. 1 is a block diagram for an exemplary content addressable memory system, according to one embodiment.

FIG. 1 is a block diagram for an exemplary content addressable memory system 100, according to one embodiment. Particularly, FIG. 1 illustrates a storage unit 102 and a match module 104. As shown in FIG. 1, the match module 104 includes a first static logic gate 106 and a second static logic gate 108.

It is appreciated that the storage unit 102 (e.g., one or more static random access memory) stores a portion of content data. In one embodiment, the match module 104 compares the portion of the content data (e.g., stored in the storage unit 102) with a respective portion of search data received by the match module 104. In one example embodiment, the match module 104 includes the first static logic gate 106 associated with a first half of the storage unit 102 for storing a sub-portion of the portion of the content data (e.g., the content bits 112). The match module 104 also includes the second static logic gate 108 associated with a second half of the storage unit 102 for storing a sub-portion of the portion of the content data (e.g., the content bits 116).

As shown in FIG. 1, the second static logic gate 108 is coupled with the first static logic gate 106. In one exemplary implementation, the first static logic gate 106 and the second static logic gate 108 are coupled together in a manner, such that the second static logic gate 108 of the CAM system 100 generates an output (HIT or MISS) signal 120.

In one exemplary implementation, the match module 104 compares the portion of the content data with the respective portion of the search data only if an enable signal 110 is received by the match module 104. In operation, the first static logic gate 106 forwards a signal (e.g., the enable/disable signal 110) for disabling the second static logic gate 108 if the sub-portion of the portion of the content data (e.g., the content bits 112) does not match with a respective sub-portion of the portion of the search data (e.g., the search bits 114).

It is appreciated that both the first static logic gate 106 and the second static logic gate 108 should generate a hit or match as their outputs for the output signal 120 to forward a hit or match. In addition, the second static logic gate 108 remains off if the first static logic gate 106 registers a miss or mismatch. As a result, needless power dissipation by the second static logic gate 108 can be avoided. The storage unit 102 and the match module 104 are explained in detail while describing FIG. 2 and FIG. 3 respectively.

Figure 2:
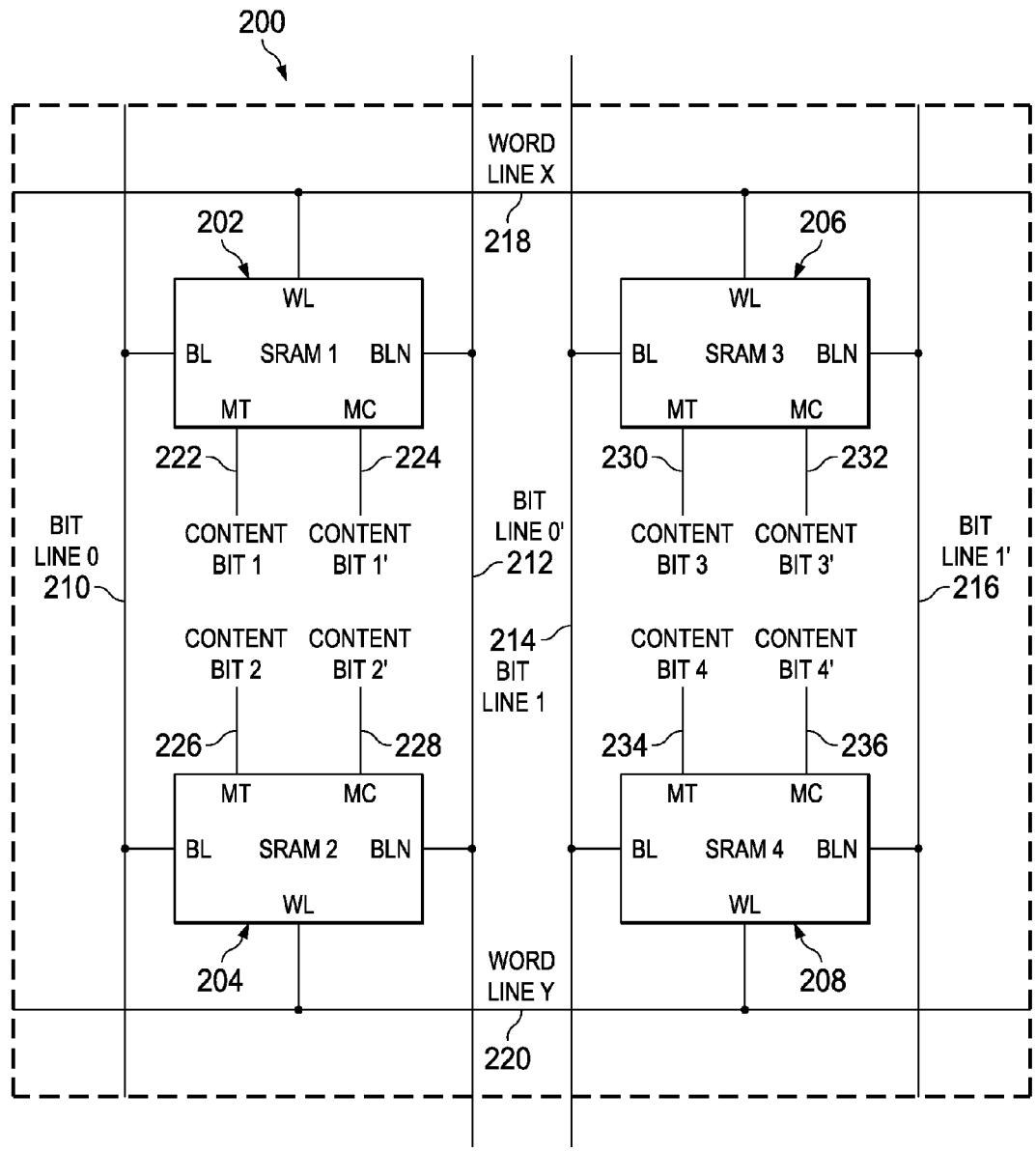
FIG. 2 is a block diagram for an exemplary storage unit of a content addressable memory, according to one embodiment.

FIG. 2 is a block diagram for an exemplary storage unit 200 of a content addressable memory, according to one embodiment. It is appreciated that the storage unit 200 is an exemplary embodiment of the storage unit 102 of FIG. 1. As shown in FIG. 2, the storage unit 200 includes one or more static random access memories (SRAMs), such as four six-transistor SRAM bit cells (e.g., SRAM 1 202, SRAM 2 204, SRAM 3 206, and SRAM 4 208) shown in FIG. 2.

In one exemplary implementation, the storage unit 200 of the ternary CAM includes four six-transistor SRAM bit cells (e.g., the SRAM 1 202, the SRAM 2 204, the SRAM 3 206, and the SRAM 4 208) for storing four content data bits (e.g., content bit 1 222, content bit 2 226, content bit 3 230 and content bit 4 234 respectively) or complementary content data bits (e.g., content bit 1' 224, content bit 2' 228, content bit 3' 232, and content bit 4' 236 respectively). Further, each of first two (e.g., the SRAM 1 202 and the SRAM 2 204) and second two (e.g., the SRAM 3 206 and SRAM 4 208) of the four six-transistor SRAM bit cells are used to store any one of a state "0," a state "1," and a state "don't care".

As shown in FIG. 2, all SRAM bit cells in a column share the same bit line (e.g., the bit line 0 210, bit line 0' 212, bit line 1 214, and bit line 1' 216), whereas, all SRAM bit cells in a row share the same word line (e.g., word line X 218 and word line Y 220). It is appreciated that the four six-transistor SRAM bit cells store the content data at nodes (e.g., MTs and MCs). For example, the content bit 1 222, content bit 2 226, content bit 3 230 and content bit 4 234 are stored in the MT nodes, and the complementary bits (e.g., the content bit 1' 224, content bit 2' 228, content bit 3' 232, and content bit 4' 236) are stored in the MC nodes.

Figure 3:
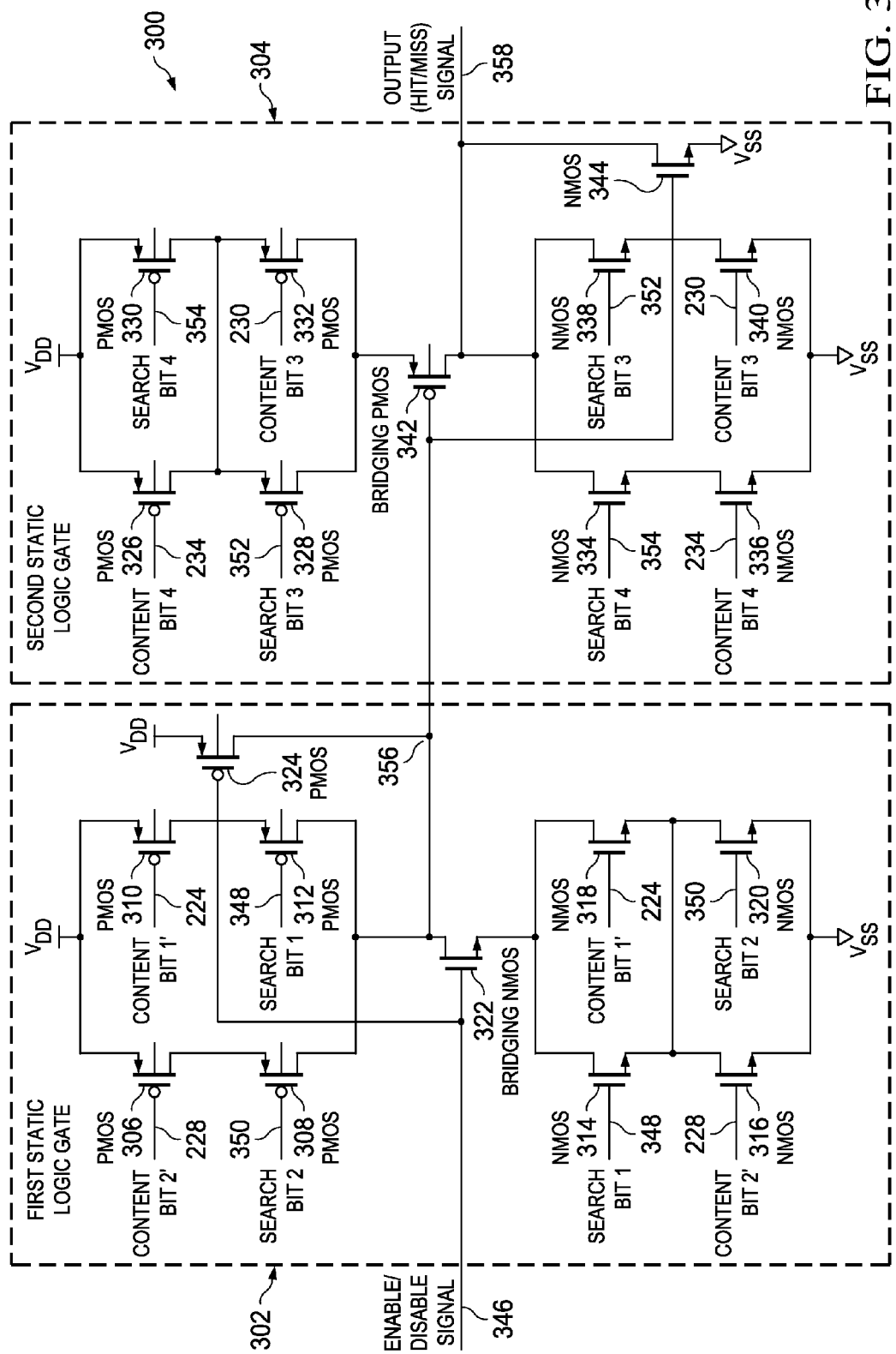
FIG. 3 is a block diagram for an exemplary match module of a ternary content addressable memory, according to one embodiment.

FIG. 3 is a block diagram for an exemplary match module 300 of a ternary content addressable memory (TCAM), according to one embodiment. It is appreciated that the match module 300 is an exemplary embodiment of the match module 104 of FIG. 1. It is also appreciated that the match module 300 is associated with the storage unit 200 of FIG. 2. In one embodiment, the match module 300 includes a first static logic gate 302 and a second static logic gate 304. As shown in FIG. 3, the first static logic gate 302 of the match module 300 includes two parallel paths of two pmos transistors in series (i.e., (pmos 306 in series with pmos 308) in parallel with (pmos 310 in series with pmos 312)) serially coupled with two parallel paths of two nmos transistors in series (i.e., (nmos 314 in series with nmos 316) in parallel with (nmos 318 in series with nmos 320)) via a bridging nmos transistor 322.

Furthermore, source nodes of two respective ones of the pmos transistors (i.e., the pmos 306 and the pmos 310) are connected to a positive power supply $V_{DD}$, and source nodes of two respective ones of the nmos transistors (i.e., the nmos 316 and the nmos 320) are connected to a negative power supply $V_{SS}$. Also, the source node of the nmos 314 is connected to the source node of the nmos 318. In addition, the first static logic gate 302 further includes an additional pmos transistor 324 with a source node of the pmos transistor 324 connected to a positive power supply $V_{DD}$, a drain node of the pmos transistor 324 connected to a drain node of the bridging nmos transistor 322, and a gate node of the pmos transistor 324 connected to a gate node of the bridging nmos transistor 322.

Similar to the first static logic gate 302, the second static logic gate 304 of the match module 300 includes two parallel paths of two pmos transistors in series (i.e., (pmos 326 in series with pmos 328) in parallel with (pmos 330 in series with 332)) serially coupled with two parallel paths of two nmos transistors in series (i.e., (nmos 334 in series with nmos 336) in parallel with (nmos 338 in series with nmos 340) via a bridging pmos transistor 342.

Further as shown in FIG. 3, source nodes of two respective ones of the pmos transistors (i.e., the pmos 326 and the pmos 330) are connected to a positive power supply $V_{DD}$, and source nodes of two respective ones of the nmos transistors (i.e., the nmos 336 and the nmos 340) are connected to a negative power supply $V_{SS}$. Also, the drain node of the pmos 326 is connected to the drain node of the pmos 330. In addition, the second static logic gate 304 further includes an additional nmos transistor 344 with a source node of the nmos transistor 344 connected to a negative power supply $V_{SS}$, a drain node of the nmos transistor 344 connected to a drain node of the bridging pmos transistor 342, and a gate node of the nmos transistor 344 connected to a gate node of the bridging pmos transistor 342.

In one embodiment, the drain of the bridging nmos 322 is an output node 356 of the first static logic gate 302. It is appreciated that, the output node 356 of the first static logic gate 302 is at logical low if a state stored (e.g., which is determined by the content bit 1 222, the content bit 2 226 and their complements) in the first two (i.e., the SRAM 1 202 and the SRAM 2 204) of the four six-transistor SRAM cells matches with a state based on respective search bits (e.g., a search bit 1 348 and a search bit 2 350) of the search data. In one exemplary implementation, the first static logic gate 302 is turned on by a high logic signal (e.g., enable signal 346) from a positive power supply $V_{DD}$ or a previous match module.

Furthermore, the drain of the bridging pmos 342 is an output node of the second static logic gate 304. It is appreciated that, the output node of the second static logic gate 302 is at logical high if a state stored (e.g., which is determined by the content bit 3 230, the content bit 4 234 and their complements) in the second two (e.g., the SRAM 3 206 and the SRAM 4 208) of the four six-transistor SRAM cells matches with a state based on respective search bits (e.g., a search bit 3 352 and a search bit 4 354) of the search data. In one exemplary implementation, the second static logic gate 304 is turned on if the first static logic gate 302 generates a match between the state of the content data in the first two of the four six-transistor SRAM bit cells and the state of the search data in the second two of the four six-transistor SRAM bit cells.

In the example embodiment illustrated in FIG. 3, the first static logic gate 302 is connected in series with the second static logic gate 304 such that the second static logic gate 304 is driven by the output of the first static logic gate 302. In one exemplary implementation, if the first static logic gate 302 senses a hit (i.e., the portion of content data matches with the respective portion of the search data), one of the series nmos path (e.g., a path formed by the nmos 314 and 316 or a path formed by the nmos 318 and 320) turns on and pulls the output (e.g., at output node 356) of the first static logic gate 302 to low.

In other words, if the first static logic gate 302 senses a miss, one of the series pmos path (e.g., a path formed by the pmos 306 and 308 or a path formed by the pmos 310 and 312) turns on and the output of the first static logic gate 302 is kept high. In case of the first static logic gate 302 senses a miss the output signal 358 of the second static logic gate 304 stays low.

Further, the second static logic gate 304 is enabled only if the first static logic gate 302 senses a hit and generates low output at the output node 356 of the first static logic gate 302. In case the second static logic gate 304 senses a hit, one of the series pmos path (e.g., a path formed by the pmos 326 and 328 or a path formed by the pmos 330 and 332) turns on and pulls the output of the second static logic gate 304 to high. In case the second static logic gate 304 senses a miss, the output of the second static logic gate 304 is kept low by one of the series nmos path (e.g., a path formed by the nmos 334 and 336 or a path formed by the nmos 338 and 340).

FIG. 4A is an exemplary logic table 400A associated with the first static logic gate 302 in the match module 300 of FIG. 3, according to one embodiment. Particularly, FIG. 4A illustrates the output (e.g., HIT or MISS) signal (e.g., at the node 356) generated by the first static logic gate 302 for different combinations of content bits and search bits.

A state 402 refers to three valid states 0, 1, don't care (X), and one invalid state stored by a ternary CAM (TCAM) storage unit. It is appreciated that two SRAM bit cells (e.g., the content bit 1 222 and the content bit 2 226) are needed to form one of the three available states. In one example embodiment, the output of the first static logic gate 302 results in a hit only if at least one of the following conditions is satisfied:

The content bit 1 222=0 and the content bit 2 226=0 form a don't care (X) state.

The search bit 1 348=1 and the search bit 2 350=1 form a don't care (X) state.

The portion of the content data (e.g., the content bit 1 222 and the content bit 2 226) matches with the respective portion of the search data (e.g., the search bit 1 348 and the search bit 2 350 respectively).

As explained in FIG. 3, if the first static logic gate 302 senses a hit, one of the series nmos path turns on and pulls the output of the first static logic gate 302 to low, else one of the series pmos path turns on and the output of the first static logic gate 302 is kept high. The CAM is designed in such a manner, that the search operation for the combination of search bit 1 408=0 and the search bit 2 410=0 is not possible as illustrated in FIG. 4A.

FIG. 4B is an exemplary logic table 400B associated with the second static logic gate 304 in the match module 300 of FIG. 3, according to one embodiment. Particularly, FIG. 4B illustrates the output (e.g., HIT or MISS) signal 358 generated by the second static logic gate 304 for different combinations of content bits and search bits.

In one example embodiment, the output of the second static logic gate 304 results in a hit only if at least one of the following conditions is satisfied:

The content bit 3 230=0 and the content bit 4 234=0 form a don't care (X) state.

The search bit 3 352=0 and the search bit 4 354=0 form a don't care (X) state.

The portion of the content data (e.g., the content bit 3 230 and the content bit 4 234) matches with complements of the respective portion of the search data (e.g., the search bit 3 352 and the search bit 4 354 respectively).

As explained in FIG. 3, if the second static logic gate 304 senses a hit, one of the series pmos path turns on and pulls the output of the second static logic gate 304 high, otherwise one of the series nmos path turns on and the output of the second static logic gate 304 is kept low. The CAM is designed in such a manner, that the search operation for the combination of search bit 3 352=1 and the search bit 4 354=1 is not possible as illustrated in FIG. 4B.

Figure 5:
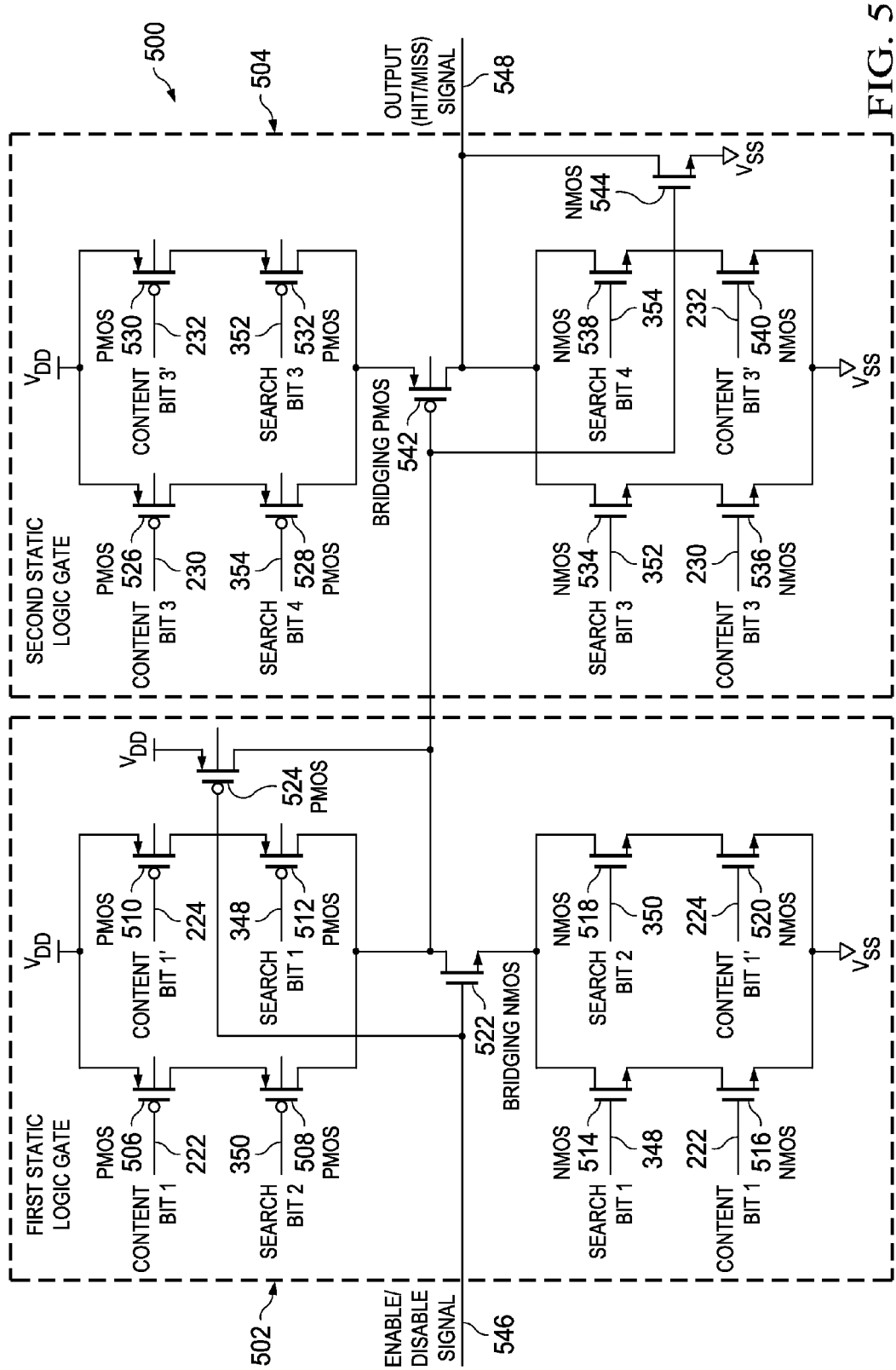
FIG. 5 is a block diagram for an exemplary match module of a binary content addressable memory, according to one embodiment.

FIG. 5 is a block diagram for an exemplary match module 500 of a binary content addressable memory (BCAM), according to one embodiment. In one embodiment, the match module 500 includes a first static logic gate 502 and a second static logic gate 504. As shown in FIG. 5, the first static logic gate 502 of the binary CAM includes two parallel paths of two pmos transistors in series (i.e., (pmos 506 in series with pmos 508) in parallel with (pmos 510 in series with pmos 512)) serially coupled with two parallel paths of two nmos transistors in series (i.e., (nmos 514 in series with nmos 516) in parallel with (nmos 518 in series with nmos 520)) via a bridging nmos transistor 522.

Further as shown in FIG. 5, source nodes of two respective ones of the pmos transistors (i.e., the pmos 506 and the pmos 510) are connected to a positive power supply $V_{DD}$, and source nodes of two respective ones of the nmos transistors (i.e., the nmos 516 and the nmos 520) are connected to a negative power supply $V_{SS}$. In addition, the first static logic gate 502 further includes an additional pmos transistor 524 with a source node of the pmos transistor 524 connected to a positive power supply $V_{DD}$, a drain node of the pmos transistor 524 connected to a drain node of the bridging nmos transistor 522, and a gate node of the pmos transistor 524 connected to a gate node of the bridging nmos transistor 522.

Similar to the first static logic gate 502, the second static logic gate 504 of the binary CAM includes two parallel paths of two pmos transistors in series (i.e., (pmos 526 in series with pmos 528) in parallel with (pmos 530 in series with 532)) serially coupled with two parallel paths of two nmos transistors in series (i.e., (nmos 534 in series with nmos 536) in parallel with (nmos 538 in series with nmos 540) via a bridging pmos transistor 542.

Further as shown in FIG. 3, source nodes of two respective ones of the pmos transistors (i.e., the pmos 526 and the pmos 530) are connected to a positive power supply $V_{DD}$, and source nodes of two respective ones of the nmos transistors (i.e., the nmos 536 and the nmos 540) are connected to a negative power supply $V_{SS}$. In addition, the second static logic gate 504 further includes an additional nmos transistor 544 with a source node of the nmos transistor 544 connected to a negative power supply $V_{SS}$, a drain node of the nmos transistor 544 connected to a drain node of the bridging pmos transistor 542, and a gate node of the nmos transistor 544 connected to a gate node of the bridging pmos transistor 542.

In one embodiment, a drain of the bridging nmos 522 is an output node of the first static logic gate 502. It is appreciated that, the output node of the first static logic gate 502 is at logical low if a state stored (e.g., content bit 1 222 and the content bits 1' 224) in the first two (i.e., the SRAM 1 202 and the SRAM 2 204) of the four six-transistor SRAM cells matches with a state based on respective search bits (e.g., the search bit 1 348 and the search bit 2 350) of the search data. In one exemplary implementation, the first static logic gate 502 is turned on by a high logic signal (e.g., enable signal 546) from a positive power supply $V_{DD}$ or a previous match module.

Further, a drain of the bridging pmos 542 is an output node of the second static logic gate 504. It is appreciated that, the output node (e.g., the output signal 548) of the second static logic gate 502 is at logical high if a state stored (e.g., the content bit 3 230 and the content bit 3' 232) in the second two (e.g., the SRAM 3 206 and the SRAM 4 208) of the four six-transistor SRAM cells matches with a state based on respective search bits (e.g., the search bit 3 352 and the search bit 4 354) of the search data. In one exemplary implementation, the second static logic gate 504 is operable only if the bridging pmos 542 is turned on by the low logic signal forwarded by the first static logic gate 502.

Figure 6:
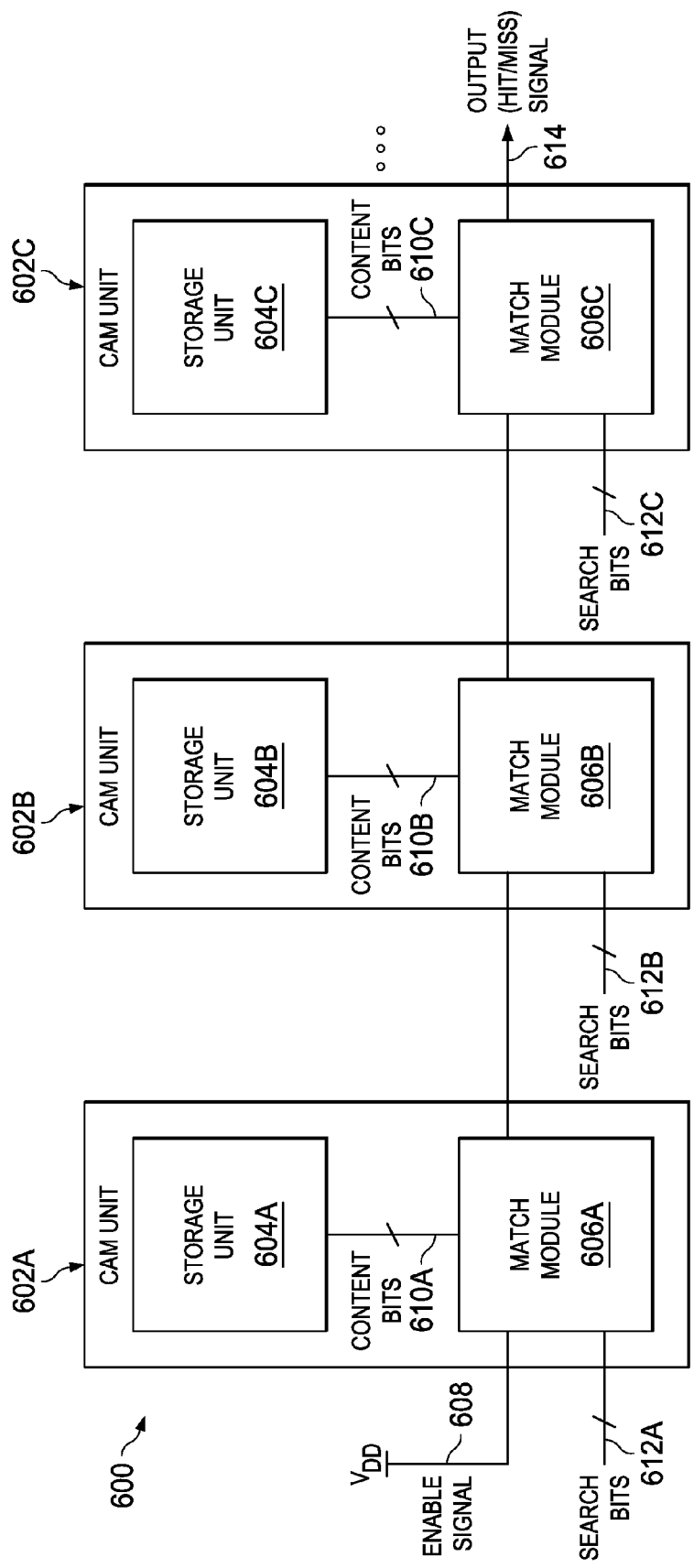
FIG. 6 is a block diagram for an exemplary content addressable memory system based on a chain of content addressable memory units, according to one embodiment.

FIG. 6 is a block diagram for an exemplary content addressable memory system 600 based on a chain of content addressable memory (CAM) units 602A-C, according to one embodiment. It is appreciated that CAM units 602A-C may collectively or individually be referred to as CAM units 602 or CAM unit 602. Storage units 604A-C may collectively or individually be referred to as storage units 604 or storage unit 604. Also, match modules 606A-C may collectively or individually be referred to as match modules 606 or match module 606. Particularly, FIG. 6 illustrates the chain of CAM units 602 for storing content data (e.g., the content bits 610A-C) and comparing the content data with search data (e.g., the search bits 612A-C).

In one example embodiment, each CAM unit 602 includes a storage unit 604 for storing a portion of the content data, and a match module 606 for comparing the portion of the content data with a respective portion of the search data. In one exemplary implementation, the content data with the search data is compared sequentially from one end of the chain of CAM units 602 to the other end of the chain of CAM units 602. For example, the comparing the content data with the search data is performed sequentially from the CAM unit 602A to the CAM unit 602C as shown in FIG. 6.

Further, the portion of the content data with the respective portion of the search data is compared in the match module 606 only if an enable signal 608 is received by the match module 606. It is appreciated that, the enable signal 608 is forwarded by a power supply (e.g., $V_{DD}$) or a previous match module in the chain of CAM units 602 if there is a match between the portion of the content data and the respective portion of the search data in the previous match module 606. The match module 606 includes at least one static logic gate for performing the comparing of the portion of the content data and the respective portion of the search data. For example, each CAM unit 602 includes a binary CAM unit or a ternary CAM unit. In the example embodiment illustrated in FIG. 6, the match module 606C generates an output (e.g., HIT or MISS) signal 614.

In one embodiment, the storage unit (e.g., 604A, 604B, 604C, etc.) comprises one or more SRAMs. For example, each of the storage units 604A-C of a ternary CAM may have four six-transistor SRAM bit cells for storing four content data bits. Each of first and second two of the four six-transistor SRAM bit cells are used to store one of a state "0," a state "1," and a state "don't care". Each match module (e.g., 606A, 606B, 606C, etc.) includes one or more one static logic gates which compare the portion of the content data and the respective portion of the search data. Each of the static logic gates includes a first static logic gate associated with the first two of the four six-transistor SRAM bit cells and a second static logic gate associated with the second two of the four six-transistor SRAM bit cells. The first static logic gate is turned on by a high logic signal from a positive power supply ($V_{DD}$) or a previous match module. The second static logic gate is turned on if the first static logic gate generates a match between the state of the content data in the first two of the four six-transistor SRAM bit cells and the state of the search data in the second two of the four six-transistor SRAM bit cells.

Figure 7:
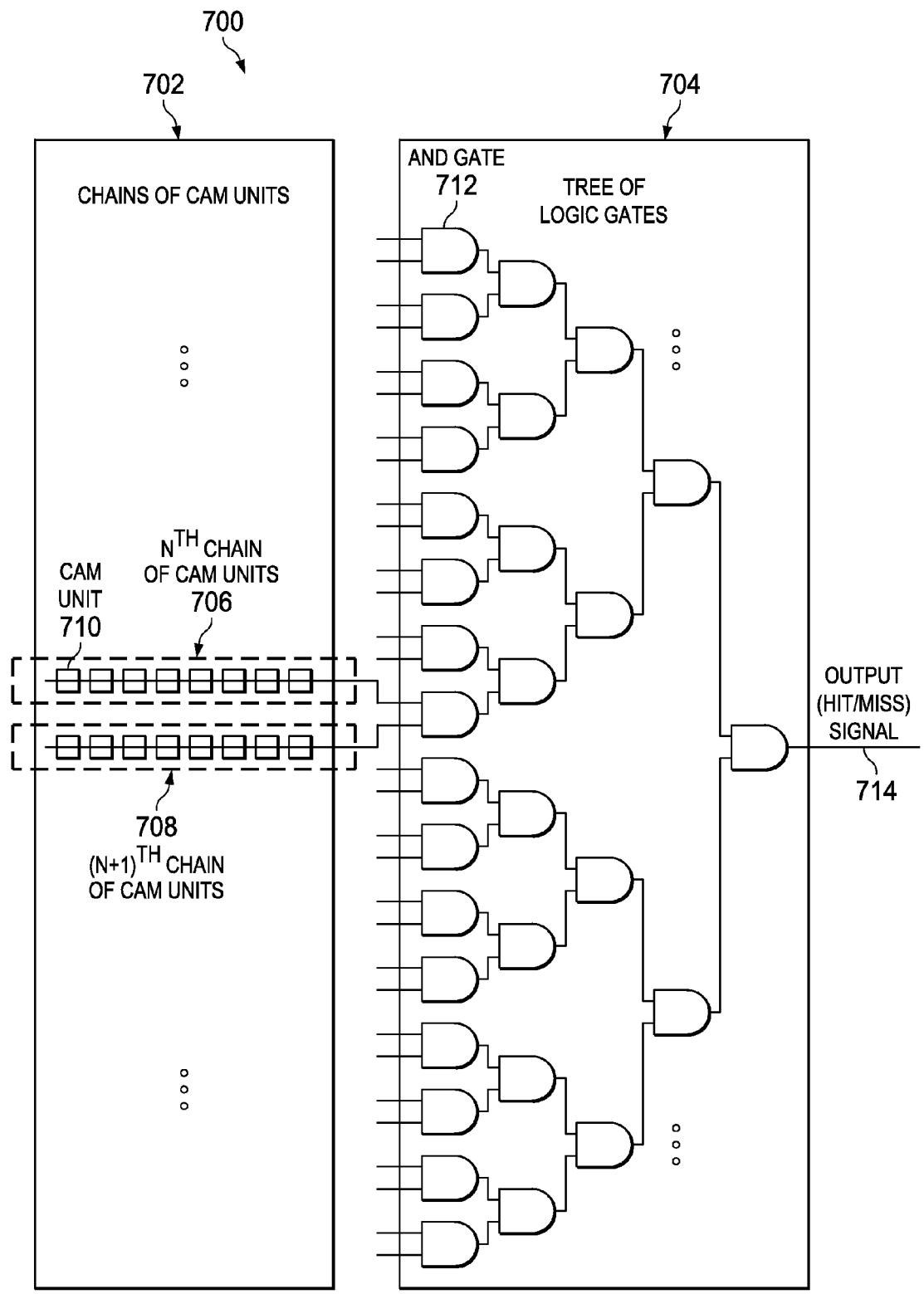
FIG. 7 is a block diagram for an exemplary content addressable memory system based on multiple chains of content addressable memory units, according to one embodiment.

FIG. 7 is a block diagram for an exemplary content addressable memory system 700 based on multiple chains of content addressable memory (CAM) units 702, according to one embodiment. Particularly, FIG. 7 illustrates the chains of CAM units 702 and a tree of logic gates 704. As shown in FIG. 7, the chains of CAM units 702 includes $N^{th}$ chain of CAM units 706, $(N+1)^{th}$ chain of CAM units 708, and so on. Further, each of the chains of CAM units 702 includes at least one CAM unit 710.

Further as shown in FIG. 7, the tree of logic gates 704 includes one or more AND gates 712 arranged in a logic tree structure. The chains of CAM units 702 store content data and compare the content data with search data. It is appreciated that each chain of CAM units is an exemplary embodiment of the CAM system 600 of FIG. 6. As described above, each CAM unit 710 includes the storage unit for storing the portion of the content data, and the match module for comparing the portion of the content data with a respective portion of the search data. It is appreciated that each CAM unit 710 is an exemplary embodiment of the CAM system 100 of FIG. 1.

In one exemplary implementation, the tree of logic gates 704 processes respective output signals of the chains of match modules in parallel. For example, a match between the content data and the search data is determined only if every one of the output signals indicates a match. In one example embodiment, the tree of logic gates 704 includes an AND gate, an OR gate, or an inverter.

In the example embodiment illustrated in FIG. 7, the chains of CAM units 702 includes a ripple chain of bit cells and the tree of logic gates 704 includes a constant AND tree structure to generate the final hit/miss output. Alternatively, an OR tree structure or an inverter logic can be used instead of AND tree structure depending on area-speed tradeoffs. Each bit cell in the ripple chain of bit cells activates only if the previous bit cell senses a hit. As explained above, the hit moves serially in a ripple fashion from one end to other end in the chains of CAM units 702. Further, the control moves from the chains of CAM units 702 to the tree of logic gates 704, only when all the bit cells in the ripple chain sense hit. In one example embodiment, sensing in the chains of CAM units 702 occurs serially, whereas sensing in the tree of logic gates 704 occurs in parallel.

For example, as illustrated in FIG. 7, each of the chains of CAM units 702 represents an 8-bit ripple chain and the tree of logic gates 704 includes 5 levels of AND gates. The first level of AND gates includes 16 blocks, second level of AND gates includes 8 blocks and so on. The architecture illustrated in FIG. 7 combines blocks of ripple chains through an AND logic tree structure, thereby introducing parallelism and imparting speed to the HIT/MISS search operation.

It is appreciated that the tree of logic gates 704 can be variable in terms of its height and depth. It is also appreciated that the length of each chain of CAM units (e.g., the chains of CAM units 702) is configurable as well. For example, if the first level of AND gates are designed with four input AND gates, the final output will come in four stages, thus achieving higher speed at less power. Similarly, fewer stages may be needed in the tree of logic gates 704 if each chain of CAM units is designed with more CAM units. For instance, if each chain of CAM units is extended by two folds, four stages (e.g., with 8 AND gates, 4 AND gates, 2 AND gates and 1 AND gate for the first, second, third, and fourth stages, respectively) may be needed for the tree of logic gates 704. With longer chains of CAM units 702 and fewer stages in the tree of logic gates 704, the system power can be saved at the expense of the system speed. On the other hand, with shorter chains of CAM units 702 and more stages in the tree of logic gates 704, higher system speed can be achieved at the expense of the system power.

The above-described technique drastically reduces power consumption since the tree of logic gates 704 activates only when all bit cells in the ripple chain sense hit. The above-described technique is a compiler-friendly architecture as the tree of logic gates 704 remains fixed and only the chains of CAM units 702 grow serially. In this case, an increase or decrease in the number of columns of the chains of CAM units 702 results in serial addition or deletion of bit cells in the ripple chain of bit cells without affecting the tree of logic gates stage 704. In addition, the above-described technique of sensing a HIT/MISS, results in an ultra-low power CAM with a highly reduced peak current profile, thereby resulting in reduction of de-coupling capacitance (de-cap) area.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

What is claimed is:

1. A system for content addressable memory (CAM), comprising:
    a storage unit for storing a portion of content data; and
    a match module for comparing the portion of the content data with a respective portion of search data received by the match module,
    wherein the match module comprises a first static logic gate associated with a first half of the storage unit storing a sub-portion of the portion of the content data and a second static logic gate associated with a second half of the storage unit; and
    wherein the first static logic gate forwards a signal for disabling the second static logic gate if the sub-portion of the portion of the content data does not match with a respective sub-portion of the portion of the search data.

2. The system of claim 1, wherein the storage unit comprises at least one static random access memory (SRAM).

3. The system of claim 1, wherein the storage unit comprises four six-transistor SRAM bit cells.

4. The system of claim 1, wherein the CAM comprises a binary CAM.

5. The system of claim 1, wherein the CAM comprises a ternary CAM.

6. The system of claim 5, wherein the storage unit of the ternary CAM comprises four six-transistor SRAM bit cells for storing four content data bits.

7. The system of claim 6, wherein each of first and second two of the four six-transistor SRAM bit cells are used to store one of a state "0," a state "1," and a state "don't care".

8. The system of claim 1, wherein the first static logic gate is turned on by a high logic signal from a positive power supply or a previous match module.

9. A system for content addressable memory (CAM), comprising:
    a chain of CAM units for storing content data and comparing the content data with search data, with each CAM unit comprising:
    a storage unit for storing a portion of the content data; and
    a match module for comparing the portion of the content data with a respective portion of the search data,
    wherein the comparing the content data with the search data is performed sequentially from one end of the chain of CAM units to the other end of the chain of CAM units;
    wherein the comparing the portion of the content data with the respective portion of the search data in the match module is performed only if the enable signals is received by the match module; and
    wherein the match module comprises at least one static logic gate for performing the comparing of the portion of the content data and the respective portion of the search data.

10. The system of claim 9, wherein the storage unit comprises at least one static random access memory (SRAM).

11. The system of claim 9, wherein the CAM comprises a binary CAM or a ternary CAM.

12. The system of claim 11, wherein the storage unit of the ternary CAM comprises four six-transistor SRAM bit cells for storing four content data bits.

13. The system of claim 12, wherein each of first and second two of the four six-transistor SRAM bit cells are used to store one of a state "0," a state "1," and a state "don't care".

14. The system of claim 13, wherein the at least one static logic gate comprises a first static logic gate associated with the first two of the four six-transistor SRAM bit cells and a second static logic gate associated with the second two of the four six-transistor SRAM bit cells.

15. The system of claim 14, wherein the first static logic gate is turned on by a high logic signal from a positive power supply or a previous match module.

16. The system of claim 15, wherein the second static logic gate is turned on if the first static logic gate generates a match between the state of the content data in the first two of the four six-transistor SRAM bit cells and the state of the search data in the second two of the four six-transistor SRAM bit cells.

* * * * *